(12) United States Patent
Yoo et al.

(10) Patent No.: US 8,017,423 B2
(45) Date of Patent: Sep. 13, 2011

(54) METHOD FOR MANUFACTURING A THIN FILM STRUCTURE

(75) Inventors: Seongyeol Yoo, Beijing (CN); Youngsuk Song, Beijing (CN); Seungjin Choi, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 83 days.

(21) Appl. No.: 12/561,344

(22) Filed: Sep. 17, 2009

(65) Prior Publication Data

US 2010/0075451 A1 Mar. 25, 2010

(30) Foreign Application Priority Data

Sep. 19, 2008 (CN) .......................... 2008 1 0222550

(51) Int. Cl.
*H01L 21/00* (2006.01)
(52) U.S. Cl. .... 438/42; 438/158; 438/609; 257/E21.414
(58) Field of Classification Search .................... 438/42, 438/34, 158, 159, 609
See application file for complete search history.

(56) References Cited

U.S. PATENT DOCUMENTS

| | | | | |
|---|---|---|---|---|
| 5,504,033 A | * | 4/1996 | Bajor et al. | ................... 438/405 |
| 2007/0212872 A1 | * | 9/2007 | Daubenspeck et al. | ....... 438/620 |

* cited by examiner

*Primary Examiner* — Charles D Garber
*Assistant Examiner* — Reema Patel
(74) *Attorney, Agent, or Firm* — Ladas & Parry LLP

(57) ABSTRACT

The present invention discloses a method for manufacturing thin film structure, which comprises the following steps: providing a substrate having a first recess and a second recess formed therein with the first recess being deeper than the second recess; depositing a first material layer and a second material layer of different thicknesses successively on the substrate; and grinding the substrate so that a flat upper surface is formed and the first material layer and the second material layer are remained in the first recess while only the first material layer is remained in the second recess. The present invention also discloses a method for manufacturing fringe field switching type liquid crystal display array substrate. With the present invention, it is possible to make the upper surface flat while forming patterns on two layers of thin films respectively by using a single mask.

8 Claims, 5 Drawing Sheets providing a substrate having a first recess and a second recess formed therein with the first recess being deeper than the second recess

depositing a first material layer and a second material layer of different thicknesses successively on the substrate

grinding the substrate so that a flat upper surface is formed and the first material layer and the second material layer are remained in the first recess while only the first material layer is remained in the second recess

Fig. 2

METHOD FOR MANUFACTURING A THIN FILM STRUCTURE

BACKGROUND

The present invention relates to a method for manufacturing a thin film structure on a flattened upper surface, in particular, to a method for manufacturing a thin film structure on a flattened upper surface while forming patterns on two layers of thin films respectively by using a single mask, which is in the filed of microelectronics manufacture. The present invention also relates to a method for manufacturing a fringe field switching type liquid crystal display array substrate.

Thin film process is widely used in manufacturing of microelectronics. The thin film process typically comprises the steps of: depositing various thin films such as metal layers, insulating layers and semiconductor layers on an underlying structure, and patterning by a photolithography process to provide circuits functions. The photolithography process is a method in which a photosensitive layer (photoresist) is formed on the thin film and is subjected to exposing and developing process using a pre-designed mask and then the portion of the thin film that is not covered by the photosensitive layer is etched off so as to pattern the thin film.

In the thin film process, since the patterns to be formed in respective layers are different, it is inevitable that some line segments of respective patterns such as gate lines and data lines of an array substrate of a liquid crystal display will be overlapped. Since the thin film previously deposited on a flat underlying structure is patterned, it will protrude from the underlying structure to a certain height. Therefore when other thin films are sequentially deposited on the top of each other, a step difference will be increasingly introduced in the overlying thin film, even though the individual height might be very small. Such step difference might cause patterns breakage in some layers at overlapped positions, which in turn leads to not only circuit disconnection in those layers, but also undesirable connection of layers originally insulated from each other so as to form short circuit.

Next, an existing method for manufacturing a fringe field switching type liquid crystal display array substrate will be illustrated as an example to explain the formation of a step difference.

Please refer to FIGS. 1A-1E, in which FIG. 1A is a cross sectional view after the first photolithography process during the manufacturing of a fringe field switching type liquid crystal display array substrate of the prior art; FIG. 1B is a cross sectional view after the second photolithography process during the manufacturing of a fringe field switching type liquid crystal display array substrate of the prior art; FIG. 1C is a cross sectional view after the third photolithography process during the manufacturing of a fringe field switching type liquid crystal display array substrate of the prior art; FIG. 1D is a cross sectional view after the fourth photolithography process during the manufacturing of a fringe field switching type liquid crystal display array substrate of the prior art; and FIG. 1E is a cross sectional view after the fifth photolithography process during the manufacturing of a fringe field switching type liquid crystal display array substrate of the prior art. The manufacturing steps are as follows.

First, a substrate 10 is provided, and a metal layer is deposited and subjected to the first photolithography process to form a common electrode 11 on the substrate 10, as shown in FIG. 1A. A metal layer is deposited subsequently on the substrate 10 and is subjected to the second photolithography process to form a gate line and a gate electrode 12 that is integrated with the gate line, as shown in FIG. 1B. Then, a gate insulating layer 13 is deposited on the substrate 10 and covers the gate line, the gate electrode 12 and the common electrode 11. Then, a semiconductor layer 14 and a doped semiconductor layer 15 as well as a source and drain metal layer are deposited subsequently, and are subjected to the third photolithography process to form TFT channel, source electrode 16 and drain electrode 17 by using a dual-tone mask, as shown in FIG. 1C. Next, a passivation layer 18 is deposited to cover the entire substrate 10 and is subjected to the fourth photolithography process to form vias 181, as shown in FIG. 1D. Finally, a transparent conductive material is deposited and is subjected to the fifth photolithography process to form a pixel electrode 19, as shown in FIG. 1E.

As shown in FIGS. 1A-1E, in a structure obtained by the above method, since the gate electrode 12 and the common electrode 11 protrude from the substrate, a step difference will be introduced in the thin films overlying the gate electrode and the common electrode, causing defects such as disconnection and short circuit.

Furthermore, since the mask used in the thin film process is expensive, how to reduce the number of masks to be used, in particular, how to form patterns in multiple thin film layers by using a single mask has become a key issue for cost reduction and enhancement of competitiveness in the semiconductor industry. In the prior art, a dual-tone mask is typically adopted to substitute two ordinary masks for the purpose of reducing the number of masks to be used. So-called dual-tone mask is a gray-tone mask or half-tone mask. The gray-tone mask is a mask formed with a grating pattern. The half-tone mask is a mask having difference thicknesses.

However, there is no technical solution disclosed in the prior art in which patterns are formed in multiple thin film layers by using a single mask while an upper surface of the multiple layers of thin films is flattened so that it is possible to prevent disconnection and short circuit from occurring, but also to reduce the number of masks to be used.

SUMMARY

The object of the present invention is to provide a method for manufacturing a thin film structure and a fringe field switching type liquid crystal display array substrate, which is capable of forming patterns in two thin film layers by using a single mask while forming a flat upper surface.

One embodiment of the present invention provides a method for manufacturing a thin film structure, which comprises the following steps:

Step 1: providing a substrate having a first recess and a second recess formed in an upper surface thereof with the first recess deeper than the second recess;

Step 2: depositing a first material layer and a second material layer of difference thicknesses successively on the substrate; and Step 3: grinding the substrate subjected to Step 2 so that a flat upper surface is formed and the first material layer and the second material layer are remained in the first recess while only the first material layer is remained in the second recess.

Another embodiment of the present invention also provides a method for manufacturing a fringe field switching type liquid crystal display array substrate. The array substrate comprises display regions and non-display regions, and the non-display regions comprise a wiring region and a TFT region located between the display regions. The wiring region comprises a gate line region and a common electrode region. The method comprises the following steps:

Step 1: providing a substrate having a first recess and a second recess formed in an upper surface thereof with the first recess deeper than the second recess, the first recess corresponding to the gate line region and the TFT region and the second recess corresponding to the common electrode region;

Step 2: depositing a transparent conductive layer and a gate metal layer of different thicknesses successively on the substrate; and Step 3: grinding the substrate subjected to Step 2 so that the upper surface is made flat and the transparent conductive layer and the gate metal layer are remained in the first recess while only the transparent conductive layer is remained in the second recess.

The embodiment of the present invention offers the follows advantages:

1. In the method for manufacturing a thin film structure of the present invention, the first recess and the second recess are etched in the substrate and the first material layer and the second material layer are embedded into the first recess and the second recess, thereby avoiding the step difference caused by the protrusion of the formed patterns, eliminating disconnection and short circuit caused by step difference, and thus improving the yield.

2. In the method for manufacturing a thin film structure of the present invention, the first material layer and the second material layer are formed in the first region and the second region respectively by using a single mask, thus saving one mask comparing with the manufacturing method of the prior art. As a result, the process is simplified and the cost is reduced.

3. In the method for manufacturing a fringe field switching type liquid crystal display array substrate, the first recess and the second recess are formed in the substrate by using a single mask, and the gate line and the gate electrode are formed in the first recess while the common electrode is formed in the second recess, so that the problem that step difference is introduced due to the patterns of the gate line, the gate electrode and the common electrode protruding from the substrate is addressed, breakage and short circuit caused by step difference are eliminated, and the yield is improved. At the same time, one mask is saved, and as a result, the process is simplified and the cost is reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

The technical solutions of the present invention will be further explained in details with reference to the drawings and the embodiments.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 2 is a flow chart of the method for manufacturing the thin film structure according to a first embodiment of the present invention;

DETAILED DESCRIPTION OF THE PREFERRED EMBODIMENTS

First Embodiment

Please refer to FIG. 2, in which a flow chart of the method for manufacturing the thin film structure according to a first embodiment of the present invention is shown to comprise the following steps:

Step 1: a substrate is provided to have a first recess and a second recess formed in an upper surface thereof with the first recess being deeper than the second recess;

Step 2: a first material layer and a second material layer of different thicknesses are successively deposited on the substrate;

Step 3: the substrate is grounded so that the upper surface is made flat and the first material layer and the second material layer are remained in the first recess while only the first material layer is remained in the second recess.

Next, the method for manufacturing the thin film structure according to the first embodiment of the present invention will be described in details with reference to FIGS. 3A-3E.

Figure 1A:
FIG. 1A is a cross sectional view after the first photolithography process during the manufacturing of a fringe field switching type liquid crystal display array substrate of the prior art.
Figure 1B:
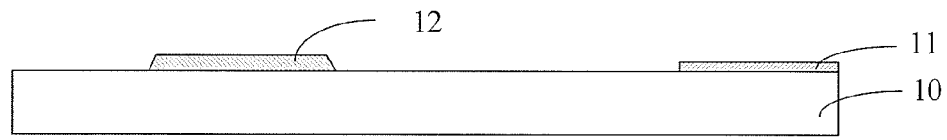
FIG. 1B is a cross sectional view after the second photolithography process during the manufacturing of a fringe field switching type liquid crystal display array substrate of the prior art.
Figure 1C:
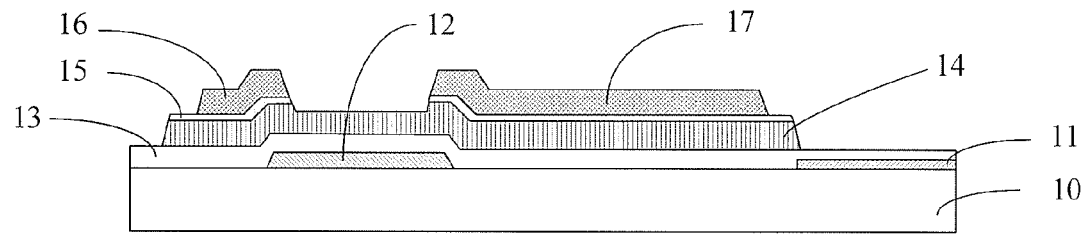
FIG. 1C is a cross sectional view after the third photolithography process during the manufacturing of a fringe field switching type liquid crystal display array substrate of the prior art.
Figure 1D:
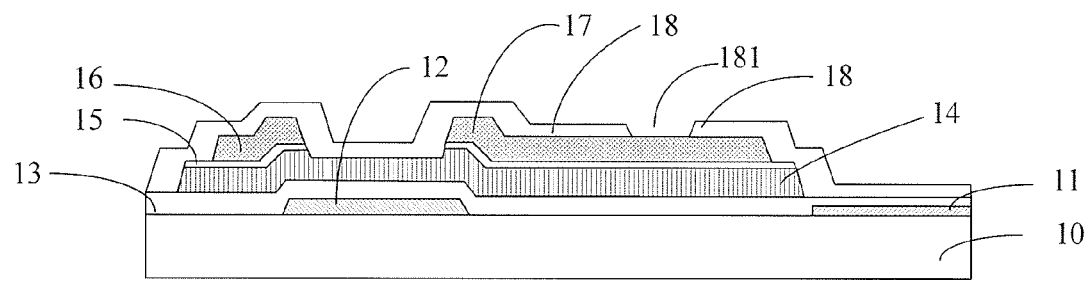
FIG. 1D is a cross sectional view after the fourth photolithography process during the manufacturing of a fringe field switching type liquid crystal display array substrate of the prior art.
Figure 1E:
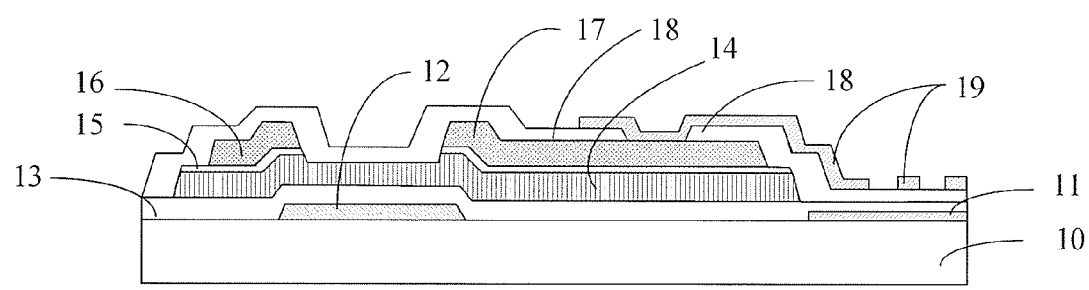
FIG. 1E is a cross sectional view after the fifth photolithography process during the manufacturing of a fringe field switching type liquid crystal display array substrate of the prior art.
Figure 3A:
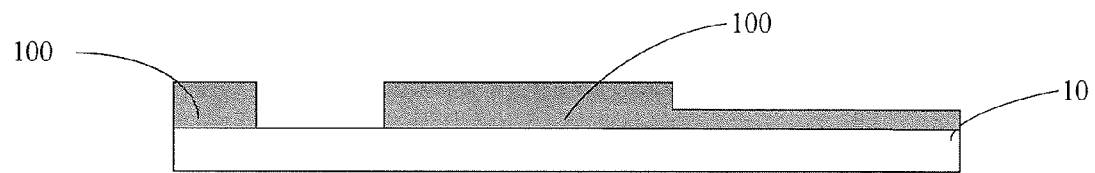
FIG. 3A is a cross sectional view of the substrate according to the first embodiment of the present invention after a photosensitive layer is formed thereon.
Figure 3B:
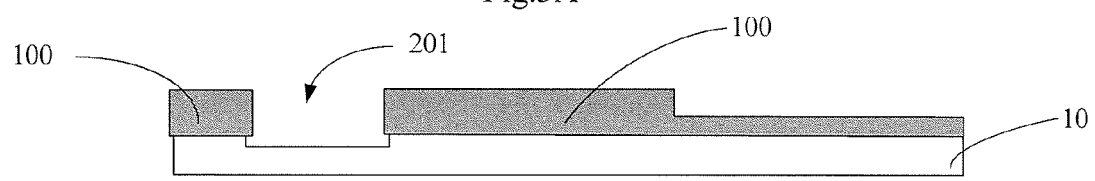
FIG. 3B is a cross sectional view of the substrate of FIG. 3A after an etching process.
Figure 3C:
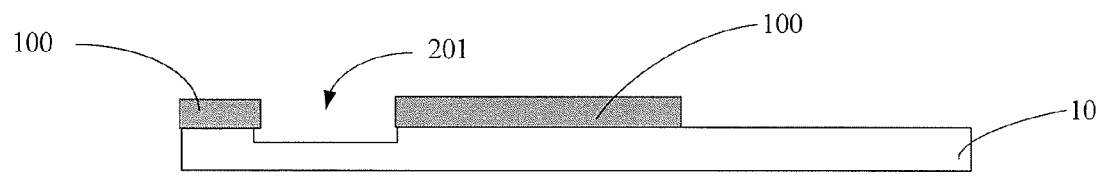
FIG. 3C is a cross sectional view of the substrate of FIG. 3B after an ashing process.
Figure 3D:
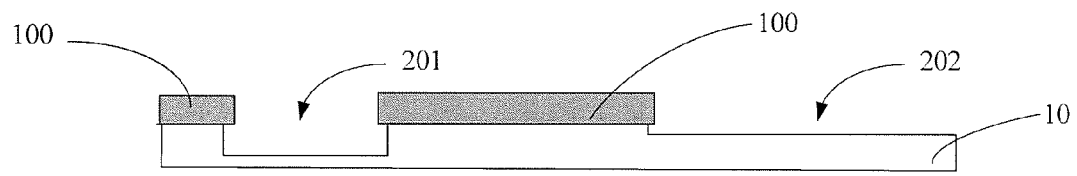
FIG. 3D is a cross sectional view of the substrate of FIG. 3C after an etching process.
Figure 3E:
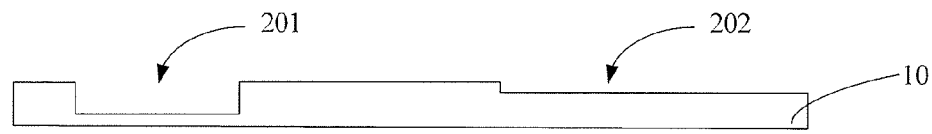
FIG. 3E is a cross sectional view of the substrate of FIG. 3D after stripping of photoresist.

Now refer to FIGS. 3A-3E in which FIG. 3A is a cross sectional view of the substrate of the present invention after the photosensitive layer is formed thereon; FIG. 3B is a cross sectional view of the substrate of FIG. 3A after an etching process; FIG. 3C is a cross sectional view of the substrate of FIG. 3B after an ashing process; FIG. 3D is a cross sectional view of the substrate of FIG. 3C after an etching process; FIG. 3E is a cross sectional view of the substrate of FIG. 3D after stripping of photoresist, the above step 1 may comprise in particular the following steps.

Step 11: a substrate with a flat upper surface is provided.

Step 12: a first recess and a second recess are formed on the upper surface of the substrate by using a dual-tone mask. The dual-tone mask is a gray-tone mask or half-tone mask. In particular, the Step 12 may comprise the following steps:

Step 121: a layer of photoresist is applied on the substrate, the photoresist layer is exposed and developed using the dual-tone mask so to form a photosensitive layer 100 which exposes the region to be formed into the first recess, and has a first thickness in the region to be formed into the second recess and a second thickness larger than the first thickness in the other regions, as shown in FIG. 3A.

Step 122: the substrate 10 is etched to remove the portion of the substrate 10 in the exposed region, so as to form the first recess 201, as shown in FIG. 3B. At this time, either wet etching or dry etching process can be used. Though the wet etching can be applied to a large area, it is difficult to control the degree of etching in the wet etching process. On the contrary, the dry etching process, though can not be applied to a large area, has the advantage of enabling precisely control of the degree of etching. Therefore, the dry etching process is preferred in order to prevent the substrate from being penetrated through due to over-etching during etching the first recess.

Step 123: the photosensitive layer 100 is subjected to an ashing process to expose the substrate 10 in the region to be formed into the second recess, as shown in FIG. 3C. At this time, the photosensitive layer 100 is removed by a thickness corresponding to the first thickness through an ashing process, so that the photosensitive layer 100 deposited in the region to be formed into the second recess and having the first thickness is removed, thereby exposing the substrate 10.

Step 124: the substrate 10 in the region to be formed into the second recess is etched to form the second recess 202, as shown in FIG. 3D. At this time, if wet etching process is used, the first recess will be etched again so that the depth of the first recess will be larger than the depth of the second recess. Dry etching process can also be applied in the present step only to the region in the substrate to be formed into the second recess with the etching depth smaller than that of the first recess. In this way, the substrate 10 can be prevented from being penetrated through the first recess 201 due to the inappropriate control of the conditions during wet etching process.

Step 125: the residual photosensitive layer 100 is removed, as shown in FIG. 3E.

In addition, a thin film can be further deposited on the substrate, and the above steps can be applied to the thin film to form the first and the second recesses. This solution provides the advantage that there is no need to worry about etching through the substrate, and thus the wet etching process can be used for a large area, which is advantageous for cost reduction.

The details of the above Step 3 of grinding the substrate are as follows.

When the thickness of the deposited first material layer is larger than the depth of the second recess, the second material layer and the first material layer are sequentially grounded, until the upper surface of the substrate except the first recess and the second recess is exposed. Thus, a flat surface in which the upper surface of the first recess and the second recess is flush with the upper surface of the substrate is obtained, and only the first material layer is remained in the second recess.

When the thickness of the deposited first material layer is smaller than the depth of the second recess, the second material layer and the first material layer and the substrate are grinded sequentially, until the upper surface of the first material layer in the second recess is exposed.

Further, the grinding can be implemented by a Chemical Mechanical Polishing (CMP) process.

In the method for manufacturing the thin film structure of the present invention, the first recess and the second recess are etched in the substrate and the first material layer and the second material layer are embedded into the first recess and the second recess so as to form a flat upper surface, thereby avoiding the step difference caused by the protrusion of the formed patterns, eliminating disconnection and short circuit caused by step difference, and thus improving the yield. Furthermore, the two patterns are formed in the first recess and the second recess respectively by using a single dual-tone mask, thus saving one mask comparing with the manufacturing method of the prior art. Therefore, the process is simplified and the cost is reduced.

Second Embodiment

In the method for manufacturing the fringe field switching type liquid crystal display array substrate according to a second embodiment of the present invention, the array substrate may comprise display regions and non-display regions. The non-display regions comprise a wiring region and a TFT region located between the display regions. The wiring regions comprise a gate line region and a common electrode region. The method may comprise the following steps.

Step 1: a substrate is provided to have a first recess and a second recess in an upper surface thereof with the first recess deeper than the second recess, in which the first recess corresponds to the gate line region and the TFT regions, and the second recess corresponds to the common electrode region.

Step 2: a transparent conductive layer and a gate metal layer of different thicknesses are successively deposited on the substrate.

Step 3: the substrate is grounded so that the upper surface is flattened and the transparent conductive layer and the gate metal layer are remained in the first recess while only the transparent conductive layer is remained in the second recess.

Next, the method for manufacturing the fringe field switching type liquid crystal display array substrate according to the second embodiment of the present invention will be described in details with reference to FIGS. 4A-4H and 5.

Figure 4A:
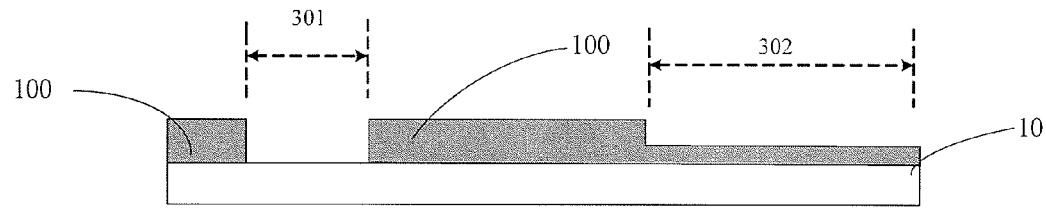
FIG. 4A is a cross sectional view of the substrate after the photosensitive layer is formed thereon in the method for manufacturing the fringe field switching type liquid crystal display array substrate according to a second embodiment of the present invention.
Figure 4B:
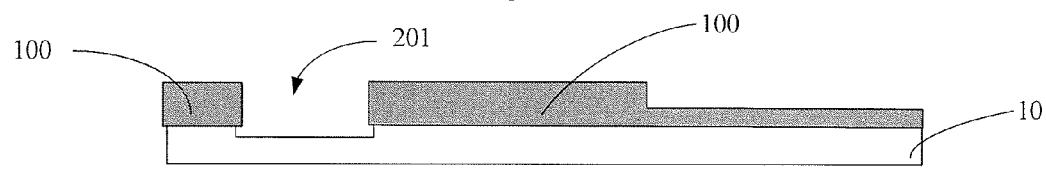
FIG. 4B is a cross sectional view of the substrate of FIG. 4A after an etching process.
Figure 4C:
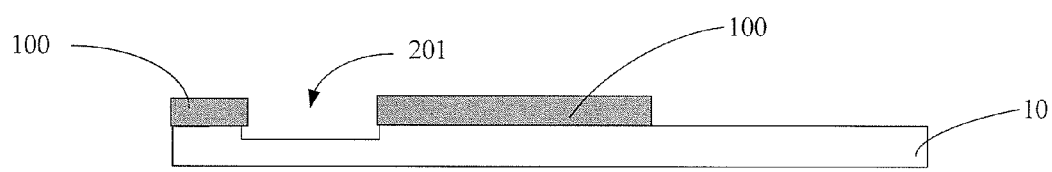
FIG. 4C is a cross sectional view of the substrate of FIG. 4B after an ashing process.
Figure 4D:
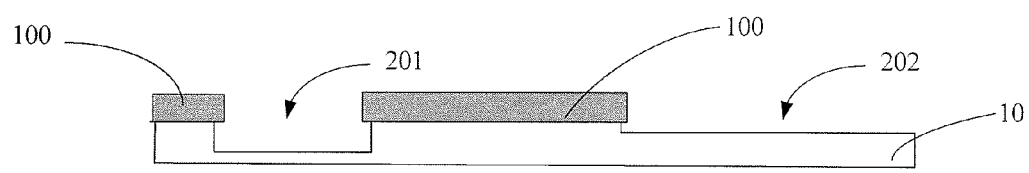
FIG. 4D is a cross sectional view of the substrate of FIG. 4C after an etching process.
Figure 4E:
FIG. 4E is a cross sectional view of the substrate of FIG. 4D after stripping of photoresist.
Figure 4F:
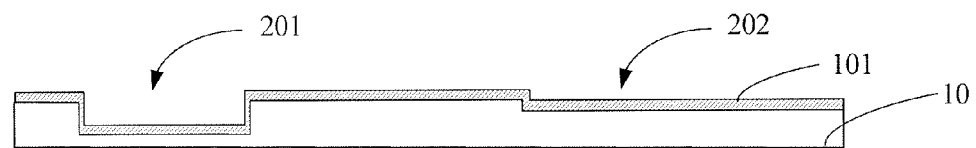
FIG. 4F is a cross sectional view of the substrate of FIG. 4E after a first material layer is deposited thereon.
Figure 4G:
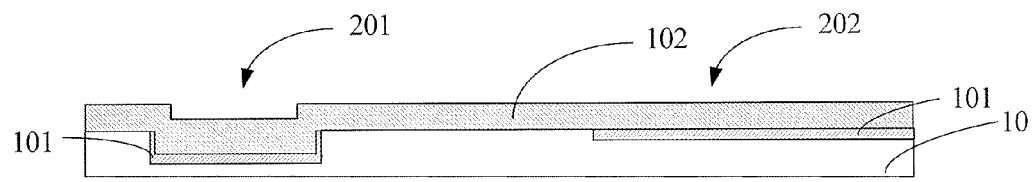
FIG. 4G is a cross sectional view of the substrate of FIG. 4F after a second material layer is deposited thereon.
Figure 4H:
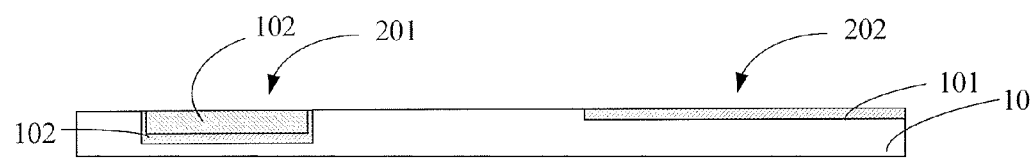
FIG. 4H is a cross sectional view of the substrate of FIG. 4G after grinding.
Figure 5:
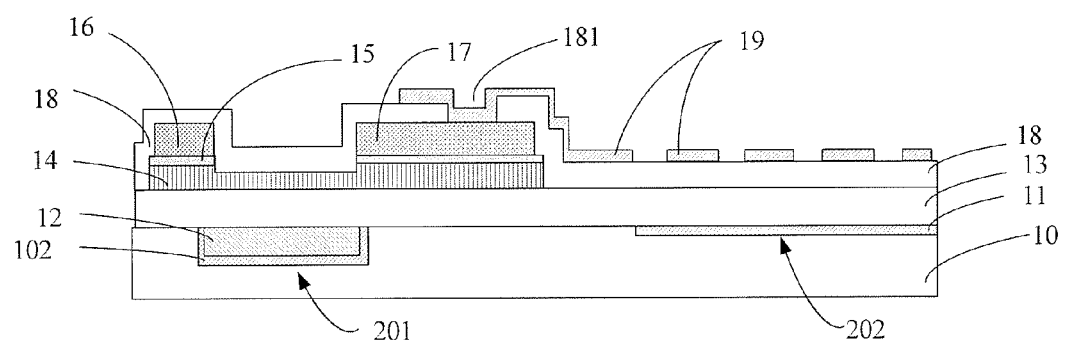
FIG. 5 is a cross sectional view of the pixel structure of the fringe field switching type liquid crystal display array substrate according to the second embodiment of the present invention.

Now refer to FIGS. 4A-4H and 5, in which FIG. 4A is a cross sectional view of the substrate after the photosensitive layer is formed thereon in the method for manufacturing the fringe field switching type liquid crystal display array substrate of the present invention; FIG. 4B is a cross sectional view of the substrate of FIG. 4A after an etching process; FIG. 4C is a cross sectional view of the substrate of FIG. 4B after an ashing process; FIG. 4D is a cross sectional view of the substrate of FIG. 4C after an etching process; FIG. 4E is a cross sectional view of the substrate of FIG. 4D after stripping of photoresist; FIG. 4F is a cross sectional view of the substrate of FIG. 4E after a first material layer is deposited thereon; FIG. 4G is a cross sectional view of the substrate of FIG. 4F after a second material layer is deposited thereon; FIG. 4H is a cross sectional view of the substrate of FIG. 4G after grinding; and FIG. 5 is a cross sectional view of the pixel structure of the fringe field switching type liquid crystal display array substrate of the present invention, the method for manufacturing the fringe field switching type liquid crystal display array substrate of the present invention may comprise the following steps.

Step 11: a substrate with a flat upper surface is provided.

Step 12: a photosensitive layer 100 is formed on the substrate 10 by applying a layer of photoresist and exposing and developing the photoresist with a dual-tone mask so that the photosensitive layer 100 exposes the substrate in the gate lines region (not shown) and the TFT region 301 and has a first thickness in the common electrode region 302 and a second thickness larger than the first thickness in the non-display regions other than the gate lines region and the TFT region, as shown in FIG. 4A.

Step 13: the substrate in the gate line region and the TFT region 301 are etched to form the first recess, as shown in FIG. 4B. Dry etching process is preferred in order to prevent the substrate from being penetrated through due to over-etching during etching the first recess.

Step 14: the photosensitive layer is subjected to an ashing process to expose the substrate in the common electrode region 302, as shown in FIG. 4C. At this time, the photosensitive layer 100 is removed by a thickness corresponding to the first thickness, so that the photosensitive layer 100 having the first thickness in the common electrode region 302 is removed to expose the substrate 10.

Step 15: the substrate in the common electrode region 302 is etched to form the second recess, as shown in FIG. 4D. At this time, if wet etching process is used, the first recess will be etched again so that the depth of the first recess will be larger than the depth of the second recess. Dry etching process can also be applied in the present step only to the region in the substrate to be formed into the second recess with the etching depth smaller than that of the first recess. In this way, the substrate 10 can be prevented from being penetrated through in the first recess 201 due to the inappropriate control of the conditions during wet etching process.

Step 16: the residual photosensitive layer 100 is removed, as shown in FIG. 4E.

Step 17: a transparent conductive layer (i.e. a first material layer 101) is deposited on the substrate 10, as shown in FIG. 4F. The thickness of the deposited transparent conductive layer is preferably larger than or equal to the etching depth of the second recess and smaller than the etching depth of the first recess. The transparent conductive layer can be selected from IZO layer or ITO layer.

Step 18: a gate metal layer (i.e. a second material layer 102) is deposited on the substrate 10, as shown in FIG. 4G. Preferably, the deposited gate metal layer fully fills the first recess 201.

Step 19: the substrate 10 is grounded so that the upper surface of the substrate 10 is flattened and the transparent conductive layer (i.e. the first material layer 101) and the gate metal layer (i.e. the second material layer 102) are remained in the first recess 201 while only the transparent conductive layer (i.e. the first material layer 101) is remained in the second recess 202. The gate metal layer in the first recess becomes the gate line and a gate electrode integrated with the gate line and the transparent conductive layer in the second recess becomes the common electrode, as shown in FIG. 4H. In particular, when the thickness of the transparent conductive layer (i.e. the first material layer 101) is larger than the depth of the second recess, the gate metal layer (i.e. the second material layer 102) and the transparent conductive layer (i.e. the first material layer 101) are grounded sequentially, until the upper surface of the substrate except the first recess and the second recess is exposed. In this way, a flat surface in which the upper surface of the substrate is flush with the upper surfaces of the first recess and the second recess is obtained, and only the transparent conductive layer (i.e. the first material layer 101) is remained in the second recess to form the common electrode. If the gate metal layer is also remained in the second recess, the aperture ratio of the display regions will be reduced, thereby degrading the display performance of the liquid crystal display. When the thickness of the transparent conductive layer (i.e. the first material layer 101) is smaller than the depth of the second recess, the gate metal layer (i.e. the second material layer 102), the transparent conductive layer (i.e. the first material layer 101) and the substrate need to be grinded sequentially, until the upper surface of the transparent conductive layer (i.e. the first material layer 101) in the second recess is exposed. Furthermore, a grinding step can be added between Step 17 and Step 18 so that the gate metal layer (i.e. the first material layer) can be deposited on a flat surface, facilitating the manufacturing process.

A gate insulating layer, an active layer (semiconductor layer or doped semiconductor layer), source and drain electrodes, TFT channels, an insulating layer, vias and a pixel electrode are successively formed on the flattened substrate having the gate line, the gate electrode and the common electrode formed therein after Step 19, by using the manufacturing methods of the related art, as shown in FIG. 5. Details of the details manufacturing steps are omitted in consideration of clarity and conciseness.

As shown in FIG. 5, for the array substrate obtained by the method for manufacturing the fringe field switching type liquid crystal display array substrate according to the second embodiment of the present invention, the source and drain metal layer and the active layer are both formed on a flat surface on which there is no step difference. Therefore, disconnection and short circuit caused by step difference can be eliminated.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A method for manufacturing a fringe field switching type liquid crystal display array substrate, the array substrate comprising display regions and non-display regions, the non-display regions comprising a wiring region and a thin film transistor (TFT) region located between the display regions, the wiring region comprising gate lines region and common electrode region, and the method comprising the following steps:

Step 1: providing a substrate having a first recess and a second recess formed in an upper surface thereof, the first recess being deeper than the second recess, the first recess corresponding to the gate line region and the TFT region, and the second recess corresponding to the common electrode region;

Step 2: depositing a transparent conductive layer and a gate metal layer of different thicknesses successively on the substrate; and Step 3: grinding the substrate subjected to the Step 2 so that the upper surface is made flat and the transparent conductive layer and the gate metal layer are remained in the first recess while only the transparent conductive layer is remained in the second recess.

2. The method for manufacturing a fringe field switching type liquid crystal display array substrate of claim 1, wherein the Step 3 of grinding the substrate comprises grinding the gate metal layer and the transparent conductive layer sequentially until the upper surface of the substrate except the first recess and the second recess is exposed.

3. The method for manufacturing a fringe field switching type liquid crystal display array substrate of claim 1, wherein the Step 3 of grinding the substrate comprises grinding the second material layer, the first material layer and the substrate successively until an upper surface of the first substance in the second recess is exposed.

4. The method for manufacturing a fringe field switching type liquid crystal display array substrate of claim 1, wherein the Step 1 comprises:

Step 11: providing the substrate having a flat upper surface;

Step 12: forming the photosensitive layer on the upper surface of the substrate by using a dual-tone mask so that the photosensitive layer exposes the substrate in the gate line region and the TFT region, and has a first thickness in the common electrode region and a second thickness that is larger than the first thickness in the regions except the gate lines region and the TFT region;

Step 13: etching the substrate in the gate line region and the TFT region to form the first recess;

Step 14: removing the photosensitive layer by ashing to expose the substrate in the common electrode region;

Step 15: etching the substrate in the common electrode region to form the second recess; and Step 16: removing the remained photosensitive layer.

5. The method for manufacturing a fringe field switching type liquid crystal display array substrate of claim 4, wherein the dual-tone mask used in the Step 12 is a gray-tone mask or half-tone mask.

6. The method for manufacturing a fringe field switching type liquid crystal display array substrate of claim 1, wherein the Step 1 comprises:

Step 11': providing the substrate having a flat upper surface;

Step 12': depositing at least one layer of thin film on the substrate, and forming the photosensitive layer on an upper surface of the thin film by using a dual-tone mask so that the photosensitive layer exposes the thin film in the gate line region, and has a first thickness in the common electrode region and a second thickness that is larger than the first thickness in the regions except the gate lines region and the TFT region;

Step 13': etching the thin film in the gate line region to form the first recess;

Step 14': removing the photosensitive layer by ashing to expose the thin film in the common electrode region;

Step 15': etching the thin film in the common electrode region to form the second recess; and Step 16': removing the remained photosensitive layer.

7. The method for manufacturing a fringe field switching type liquid crystal display array substrate of claim 1, wherein the Step 3 of grinding the substrate is implemented by a Chemical Mechanical Polishing process.

8. The method for manufacturing a fringe field switching type liquid crystal display array substrate of claim 1, wherein the Step 1 comprises:

Step 11": providing the substrate having a flat upper surface; and

Step 12": depositing at least one layer of photo-curing thin film on the substrate, and applying a exposing and developing process to an upper surface of the photo-curing thin film using a dual-tone mask to form the first recess and the second recess, the first recess corresponding to the gate line region and the second recess corresponding to the common electrode region.

* * * * *